United States Patent
Campbell et al.

(10) Patent No.: US 7,277,283 B2
(45) Date of Patent: Oct. 2, 2007

(54) COOLING APPARATUS, COOLED ELECTRONIC MODULE AND METHODS OF FABRICATION THEREOF EMPLOYING AN INTEGRATED COOLANT INLET AND OUTLET MANIFOLD

(75) Inventors: Levi A. Campbell, New Paltz, NY (US); Richard C. Chu, Hopewell Junction, NY (US); Michael J. Ellsworth, Jr., Lagrangeville, NY (US); Madhusudan K. Iyengar, Rhinebeck, NY (US); Roger R. Schmidt, Poughkeepsie, NY (US); Robert E. Simons, Poughkeepsie, NY (US)

(73) Assignee: International Business Machines Corporation, Armon, NY (US)

( * ) Notice: Subject to any disclaimer, the term of this patent is extended or adjusted under 35 U.S.C. 154(b) by 293 days.

(21) Appl. No.: 11/124,513

(22) Filed: May 6, 2005

(65) Prior Publication Data

US 2006/0250774 A1 Nov. 9, 2006

(51) Int. Cl.
  *H05K 7/20* (2006.01)
  *F28F 7/00* (2006.01)
(52) U.S. Cl. .................... 361/699; 165/80.4; 165/908
(58) Field of Classification Search ............... 165/80.4, 165/908; 361/688–689, 698–699
See application file for complete search history.

(56) References Cited

U.S. PATENT DOCUMENTS

| | | | | |
|---|---|---|---|---|
| 4,910,642 A | * | 3/1990 | Downing | 361/690 |
| 5,070,936 A | | 12/1991 | Carroll et al. | 165/80.4 |
| 5,220,804 A | | 6/1993 | Tilton et al. | 62/64 |
| 5,263,536 A | * | 11/1993 | Hulburd et al. | 165/80.4 |
| 5,270,572 A | | 12/1993 | Nakajima et al. | 257/714 |
| 5,388,635 A | * | 2/1995 | Gruber et al. | 165/80.4 |
| 5,942,432 A | | 8/1999 | Smith et al. | 435/303.1 |
| 6,366,462 B1 | * | 4/2002 | Chu et al. | 361/699 |
| 6,431,260 B1 | | 8/2002 | Agonafer et al. | 165/80.4 |
| 6,498,725 B2 | | 12/2002 | Cole et al. | 361/700 |
| 6,519,151 B2 | | 2/2003 | Chu et al. | 361/699 |
| 6,571,569 B1 | | 6/2003 | Rini et al. | 62/259.2 |
| 6,935,411 B2 | * | 8/2005 | Valenzuela | 165/80.4 |
| 7,133,286 B2 | * | 11/2006 | Schmidt et al. | 361/718 |
| 7,156,159 B2 | * | 1/2007 | Lovette et al. | 165/104.33 |
| 7,206,203 B2 | * | 4/2007 | Campbell et al. | 361/699 |
| 2004/0012914 A1 | | 1/2004 | Chu et al. | 361/679 |
| 2006/0042825 A1 | * | 3/2006 | Lu et al. | 174/252 |

OTHER PUBLICATIONS

U.S. Patent Application entitled "Fluidic Cooling Systems and Methods for Electronic Components," Pompeo et al., U.S. Appl. No. 10/904,555, filed Nov. 16, 2004.

U.S. Patent Application entitled "Cooling Apparatus, Cooled Electronic Module, And Methods Of Fabrication Thereof Employing

(Continued)

*Primary Examiner*—Gregory D Thompson
(74) *Attorney, Agent, or Firm*—Lily Neff, Esq.; Kevin P. Radigan, Esq.; Heslin Rothenberg Farley & Mesiti, P.C.

(57) ABSTRACT

A cooling apparatus and method of fabrication are provided for facilitating removal of heat from a heat generating electronic device. The cooling apparatus includes an integrated coolant inlet and outlet manifold having a plurality of inlet orifices for injecting coolant onto a surface to be cooled, and a plurality of outlet openings for exhausting coolant after impinging on the surface to be cooled. The inlet orifices and the outlet openings are interspersed in a common surface of the integrated manifold. A plurality of exit openings are also provided on at least one edge surface of the manifold. These exit openings are in fluid communication through the manifold with the outlet openings to facilitate exhausting of coolant through the outlet openings and minimize pressure drop through the manifold. At least one surface plane projection of the at least one edge surface intersects a surface plane projection of the common surface.

20 Claims, 6 Drawing Sheets

OTHER PUBLICATIONS

Thermally Conductive, Wire-Bonded Pin Fins," Campbell et al., U.S. Appl. No. 11/009,935, filed Dec. 9, 2004.

U.S. Patent Application entitled "Electronic Device Cooling Assembly And Method Employing Elastic Support Material Holding A Plurality Of Thermally Conductive Pins," Campbell et al., U.S. Appl. No. 10/873,432, filed Jun. 22, 2004.

B.R. Hollworth, et al., "Arrays of Impinging Jets with Spent Fluid Removal Through Vent Holes on the Target Surface," Journal of Engineering for Power, vol. 102, pp. 994-999 (Oct. 1980).

* cited by examiner fig. 1 fig. 2 fig. 4B fig. 4A

COOLING APPARATUS, COOLED ELECTRONIC MODULE AND METHODS OF FABRICATION THEREOF EMPLOYING AN INTEGRATED COOLANT INLET AND OUTLET MANIFOLD

CROSS REFERENCE TO RELATED APPLICATIONS

This application contains subject matter which is related to the subject matter of the following applications, each of which is assigned to the same assignee as this application and each of which is hereby incorporated herein by reference in its entirety:

"Fluidic Cooling Systems and Methods for Electronic Components," Pompeo et al., now U.S. Letters Patent No. 7,079,393, issued Jul. 18, 2006;

"Cooling Apparatus, Cooled Electronic Module, and Methods of Fabrication Thereof Employing Thermally Conductive, Wire-Bonded Pin Fins," Campbell et al., Ser. No. 11/009,935, filed Dec. 9, 2004, and published Jun. 15, 2006 as U.S. Patent Application Publication No. U.S. 2006/0126308 A1;

"Electronic Device Cooling Assembly and Method Employing Elastic Support Material Holding a Plurality of Thermally Conductive Pins," Campbell et al., now U.S. Letters Patent No. 7,206,203, issued Apr. 17, 2007;

"Electronic Device Substrate Assembly With Multilayer Impermeable Barrier and Method of Making", Chu et al., now U.S. Letters Patent No. 6,940,712, issued Sep. 6, 2005; and "Cooling Apparatus, Cooled Electronic Module and Methods of Fabrication Thereof Employing an Integrated Manifold and a Plurality of Thermally Conductive Fins," Campbell et al., Ser. No. 11/124,064, filed May 6, 2005, and published Nov. 9, 2006 as U.S. Patent Application Publication Ser. No. U.S. 2006/0250773 A1.

TECHNICAL FIELD OF THE INVENTION

The present invention relates to heat transfer mechanisms, and more particularly, the cooling apparatuses, cooled electronic modules and methods of fabrication thereof for removing heat generated by one or more electronic devices. Still more particularly, the present invention relates to cooling apparatuses and methods employing at least one integrated coolant inlet and outlet manifold for facilitating the impingement of coolant onto a surface to be cooled and the exhausting of coolant after impinging on the surface to be cooled in an effective and efficient manner with minimum coolant pressure drop across the manifold.

BACKGROUND OF THE INVENTION

As is known, operating electronic devices produce heat. This heat should be removed from the devices in order to maintain device junction temperatures within desirable limits, with failure to remove the heat thus produced resulting in increased device temperatures, potentially leading to thermal runaway conditions. Several trends in the electronics industry have combined to increase the importance of thermal management, including heat removal for electronic devices, including technologies where thermal management has traditionally been less of a concern, such as CMOS. In particular, the need for faster and more densely packed circuits has had a direct impact on the importance of thermal management. First, power dissipation, and therefore heat production, increases as device operating frequencies increase. Second, increased operating frequencies may be possible at lower device junction temperatures. Further, as more and more devices are packed onto a single chip, power density (Watts/cm$^2$) increases, resulting in the need to remove more power from a given size chip or module. These trends have combined to create applications where it is no longer desirable to remove heat from modern devices solely by traditional air cooling methods, such as by using air cooled heat sinks with heat pipes or vapor chambers. Such air cooling techniques are inherently limited in their ability to extract heat from an electronic device with high power density.

Thus, the need to cool current and future high heat load, high heat flux electronic devices, mandates the development of aggressive thermal management techniques, such as liquid jet impingement or liquid cooled microstructure cold plate devices to cool electronic devices, such as integrated circuit chips. The invention disclosed herein is addressed to this continuing need for enhanced liquid based cooling apparatuses and methods of cooling.

SUMMARY OF THE INVENTION

The shortcomings of the prior art are overcome and additional advantages are provided through the provision of a cooling apparatus. The cooling apparatus includes an integrated coolant inlet and outlet manifold. The manifold has a plurality of inlet orifices for injecting coolant onto a surface to be cooled, and a plurality of outlet openings for exhausting coolant after impinging on the surface to be cooled. The plurality of inlet orifices and the plurality of outlet openings are interspersed in a common surface of the integrated coolant inlet and outlet manifold. Further, a plurality of exit openings are provided in at least one edge surface of the integrated coolant inlet and outlet manifold. The exit openings are in fluid communication through the manifold with the plurality of outlet openings to facilitate exhausting of coolant through the plurality of outlet openings and minimize pressure drop through the manifold. Further, at least one surface plane projection of the at least one edge surface intersects a surface plane projection of the common surface of the manifold.

In enhanced aspects, the plurality of exit openings are disposed in two edge surfaces of the integrated coolant inlet and outlet manifold, and a surface plane projection of each surface of the two edge surfaces intersects the surface plane projection of the common surface. Additionally, a plurality of outlet slots are disposed in the integrated manifold in fluid communication with the plurality of outlet openings in the common surface and the plurality of exit openings in the two edge surfaces. When this integrated manifold is operational, a bifurcated coolant flow exits within each outlet slot from at least one outlet opening to at least two exit openings in the two edge surfaces of the integrated manifold. In another enhanced aspect, the integrated manifold includes a plurality of inlet slots in fluid communication with the plurality of inlet orifices for facilitating injecting of coolant onto the surface to be cooled. The plurality of inlet slots and the plurality of outlet slots are disposed parallel and interdigitized within the integrated coolant inlet and outlet manifold. In a still further aspect, the plurality of outlet openings comprise a plurality of elongated outlet openings, and the plurality of inlet orifices are aligned in multiple rows in the common surface of the integrated manifold, wherein the multiple rows of inlet orifices and the plurality of elongated outlet openings are disposed interdigitized in the common surface of the manifold.

A cooled electronic module, methods of fabricating a cooling apparatus and a cooled electronic module, as well as methods for cooling electronic devices are also presented and claimed herein.

Further, additional features and advantages are realized through the techniques of the present invention. Other embodiments and aspects of the invention are described in detail herein and are considered a part of the claimed invention.

BRIEF DESCRIPTION OF THE DRAWINGS

The subject matter which is regarded as the invention is particularly pointed out and distinctly claimed in the claims at the conclusion of the specification. The foregoing and other objects, features, and advantages of the invention are apparent from the following detailed description taken in conjunction with the accompanying drawings in which:

BEST MODE FOR CARRYING OUT THE INVENTION

As used herein "electronic device" comprises any heat generating electronic component of a computer system or other electronic system requiring cooling. In one example, the electronic device is or includes an integrated circuit chip, a semiconductor chip and/or an electronic component. The term "cooled electronic module" includes any electronic module with cooling and at least one electronic device, with single-chip modules and multi-chip modules being examples of a cooled electronic module as described herein. The "surface to be cooled" refers to a surface of the electronic device itself, or to an exposed surface of a thermal cap, thermal spreader, passivation layer, or other surface in thermal contact with the electronic device, and through which heat generated by the electronic device is to be extracted. As used herein, "micro-scaled cooling structure" means a cooling structure with a characteristic dimension of 200 micrometers (microns) or less.

Generally stated, provided herein is an enhanced cooling apparatus and method of fabrication which allow for high heat transfer from a surface of an electronic device to be cooled using a direct (or indirect) liquid coolant impingment approach. In one embodiment, the cooling liquid may comprise a water-based, two-phase coolant. However, the concepts disclosed herein are readily adapted to use with other types of coolant, either two-phase or single-phase. For example, the coolant may comprise a brine, a fluorocarbon liquid, a liquid metal, or other similar coolant, or refrigerant, while still maintaining the advantages and unique features of the present invention.

Figure 1:
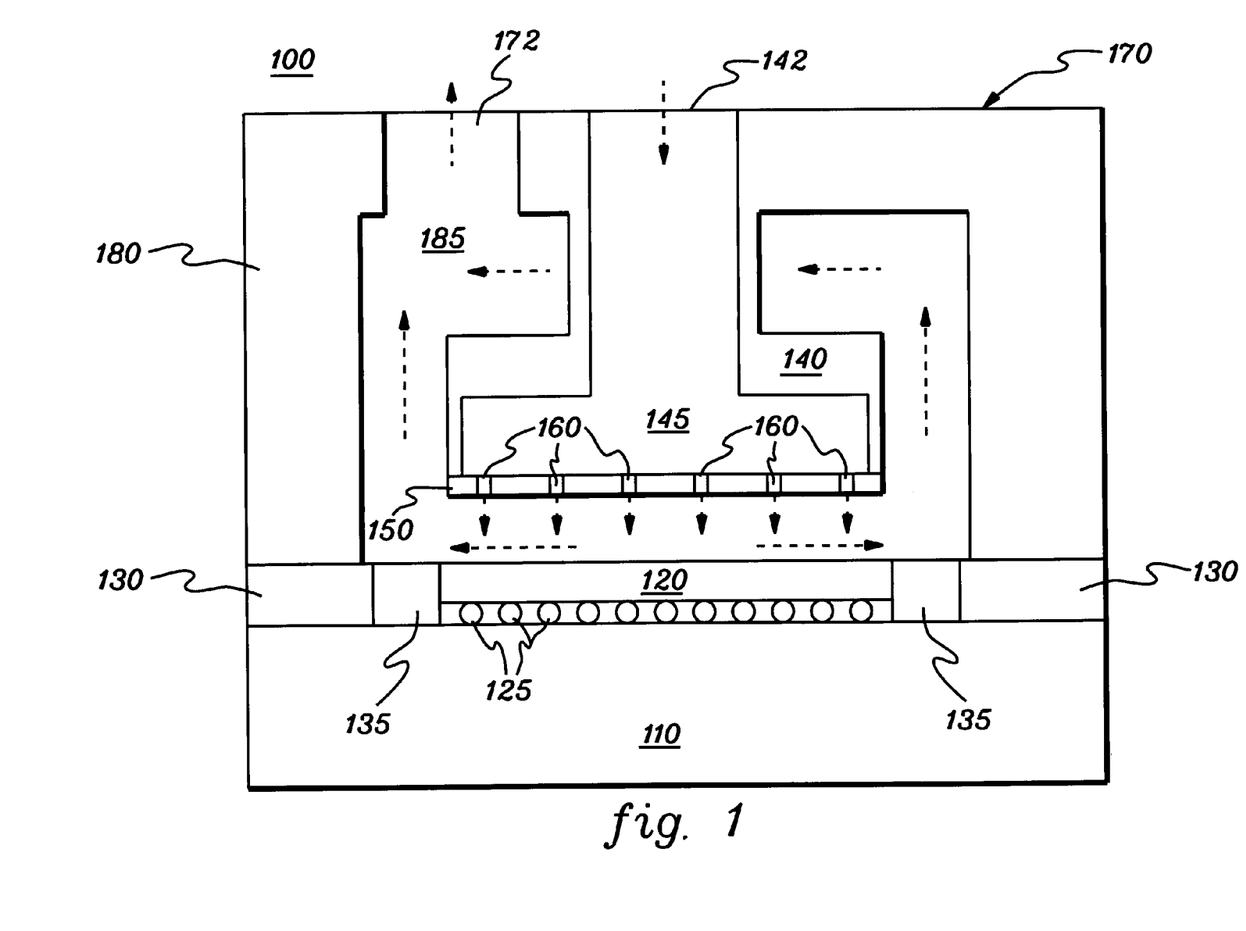
FIG. 1 is a cross-sectional elevational view of one embodiment of a cooled electronic module, in accordance with an aspect of the present invention.

FIG. 1 depicts one embodiment of a cooled electronic module, generally denoted 100, in accordance with an aspect of the present invention. In this embodiment, cooled electronic module 100 includes a substrate 110, which may include conductive wiring (not shown) on an upper surface thereof and/or imbedded therein. An electronic device 120 is electrically connected to the wiring of substrate 110 via, for example, solder ball connections 125 (also referred to as controlled collapse chip connections, or C4s). A sealing structure 130, which in one embodiment could comprise a plate with a center opening, facilitates isolation of the active circuit portion of the electronic device 120, as well as the connections 125 and substrate surface metallurgy, from coolant within the module. A sealant 135, such as an epoxy, provides a fluid-tight seal between sealing structure 130 and chip 120. This hermetic seal is desirable if the coolant is aqueous in nature. The housing 170 is sealed to sealing structure 130 via, for example, solder or brazing. Housing 170 includes an inlet plenum housing 140 and an outlet plenum housing 180 (or peripheral return manifold structure). Inlet plenum housing 140 includes an inlet plenum 145 which receives coolant through at least one inlet opening 142 and directs coolant through a plurality of orifices 160, disposed in an orifice plate 150, onto a surface of electronic device 120. In one embodiment, orifices 160 comprise jet orifices which provide an impinging jet flow onto the surface of the electronic device to be cooled. After impinging on the surface to be cooled, the coolant flows over the electronic device surface towards the periphery thereof, where it turns upwards and exits through an outlet manifold 185 via at least one outlet port 172.

In operation, several disadvantages of a cooled electronic module as depicted in FIG. 1 may arise. For example, there may be a prohibitive pressure drop in a two-phase cooling system due to vapor build up between the orifice plate 150 and the electronic device 120. This is because the specific volume of vapor is significantly greater than that of the coolant in liquid phase. Additionally, a large coolant temperature rise may occur when the coolant is a liquid metal (which has a low specific heat characteristic). Further, a potentially poor rate of heat transfer at the periphery of the electronic device may occur due to the effluent wash effect, which exacerbates non-uniformity in the heat transfer coefficient across the surface of the electronic device.

Figure 2:
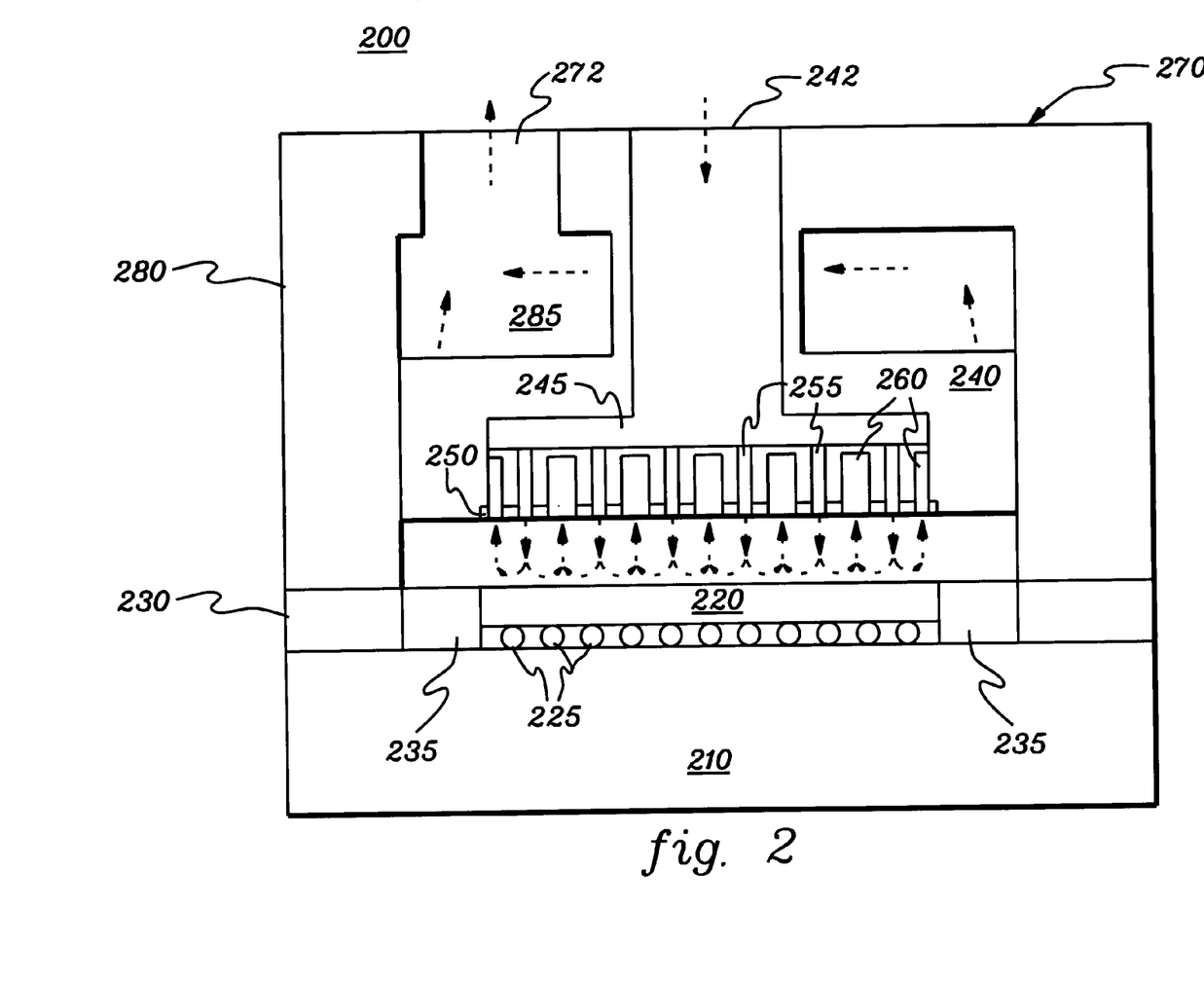
FIG. 2 is a cross-sectional elevational view of another embodiment of a cooled electronic module employing an integrated coolant inlet and outlet manifold, in accordance with an aspect of the present invention.

FIG. 2 depicts an alternate embodiment of a cooled electronic module, generally denoted 200, in accordance with another aspect of the present invention. In this embodiment, cooled electronic module 200 again includes a substrate 210, which may include conductive wiring (not shown) on an upper surface thereof and/or imbedded therein. An electronic device 220, such as an integrated circuit chip, is electrically connected to the wiring of the substrate 210 via, for example, solder ball connections 225. A sealing structure 230 facilitates isolation of the active circuit portion of electronic device 220 (as well as connections 225 and the substrate surface metallurgy) from coolant within the module. Sealant 235 provides a fluid-tight seal between electronic device 220 and sealing structure 230. A housing 270, which is sealed to sealing structure 230 via, for example, solder or brazing, induces an inlet plenum housing 240 and an outlet plenum housing 280.

In this embodiment, inlet plenum housing 240 includes an inlet plenum 245 which receives coolant via at least one inlet port 242 and provides the coolant to an integrated manifold having a plurality of inlet slots 255, which extend between inlet plenum 245 and an orifice plate 250 of the manifold. In this embodiment, a plurality of outlet slots 260 are also provided in the manifold, parallel and interdigitized with the plurality of inlet slots 255. As illustrated further below in connection with embodiment of FIGS. 3A-6, these outlet slots 260 exhaust coolant through a plurality of exit openings in at least one edge surface of the integrated coolant inlet and outlet manifold to an outlet plenum 285, from which the exhausted coolant exits through at least one exit port 272 in the housing 270.

In one embodiment, the plurality of outlet slots 260 are parallel coolant return passages provided in the integrated manifold structure to allow coolant to immediately leave the electronic device vicinity after cooling the surface via jet impingement. This is illustrated by the arrow directional flows in FIG. 2 wherein coolant is expelled through the jet orifices and impinges on the surface of the electronic device, is turned by the surface to be cooled and withdrawn through the plurality of outlet openings in fluid communication with the plurality of outlet slots 260. Advantageously, the integrated manifold structure disclosed herein reduces pressure drop through the manifold, especially for two-phase designs and allows exhaust coolant (liquid or vapor) to immediately exit after cooling the surface to be cooled. Further, a lower coolant temperature across the surface to be cooled in a single-phase system, and a reduced vapor build up in a two-phase system, is achieved, thus increasing the maximum allowable device heat flux. Still further, the design of FIG. 2 eliminates the effluent wash effect of FIG. 1, leading to a relatively uniform heat transfer coefficient on the surface that is to be cooled. The design of the integrated manifold and a fabrication approach therefore is described further below with respect to FIGS. 3A-6.

Figure 3A:
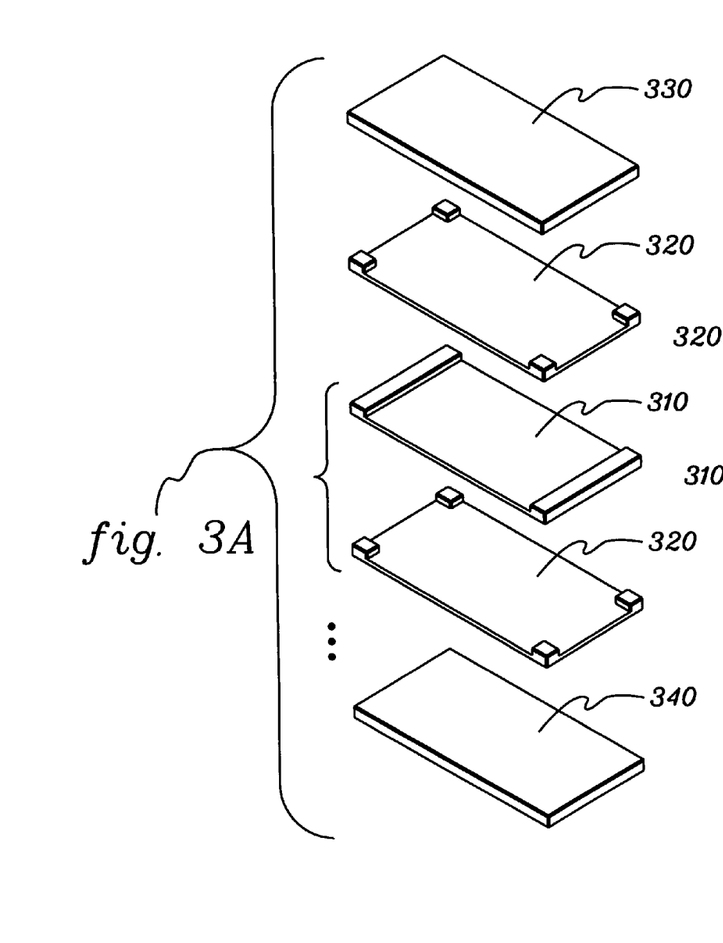
FIG. 3A is an exploded, isometric view of one embodiment of several types of plates to be assembled into a stack subassembly of an integrated coolant inlet and outlet manifold, in accordance with an aspect of the present invention.
Figure 3B:
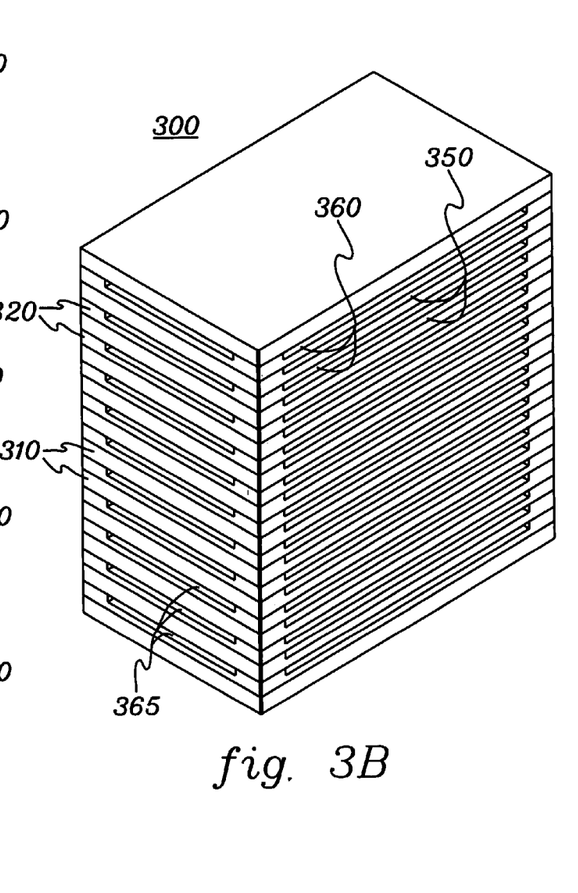
FIG. 3B is an isometric view of one assembled stack subassembly embodiment, employing multiple layers of plates of the types shown in FIG. 3A, in accordance with an aspect of the present invention.

FIGS. 3A & 3B depict fabrication of a manifold subassembly, generally denoted 300, in accordance with an aspect of the present invention. This subassembly can be fabricated by machining thin slots into two different metal plates 310, 320 having (by way of example) the geometry shown in FIG. 3A. Those skilled in the art should note, however, that the geometry and thickness of one or more of the different plates can vary, as well as the depth and configuration of the slots machined therein, without departing from the scope of the present invention. In one implementation, the metal plates might comprise stainless steel or copper. After machining a plurality of these plates, for example, by skiving or etching, the plates are assembled with end capping structures 330, 340 into a stack subassembly as shown in FIG. 3B. Specifically, the two different types of plates 310, 320 are stacked in an alternate manner and joined using a brazing, solder, or comparable process (e.g., diffusion bonding). As shown in FIG. 3B, the resultant stack subassembly has a plurality of interdigitated slots 350, 360. In addition, exit openings 365 in two edge surfaces of the stack are in fluid communication with slots 360 (which are to comprise the outlet slots).

Figure 4A:
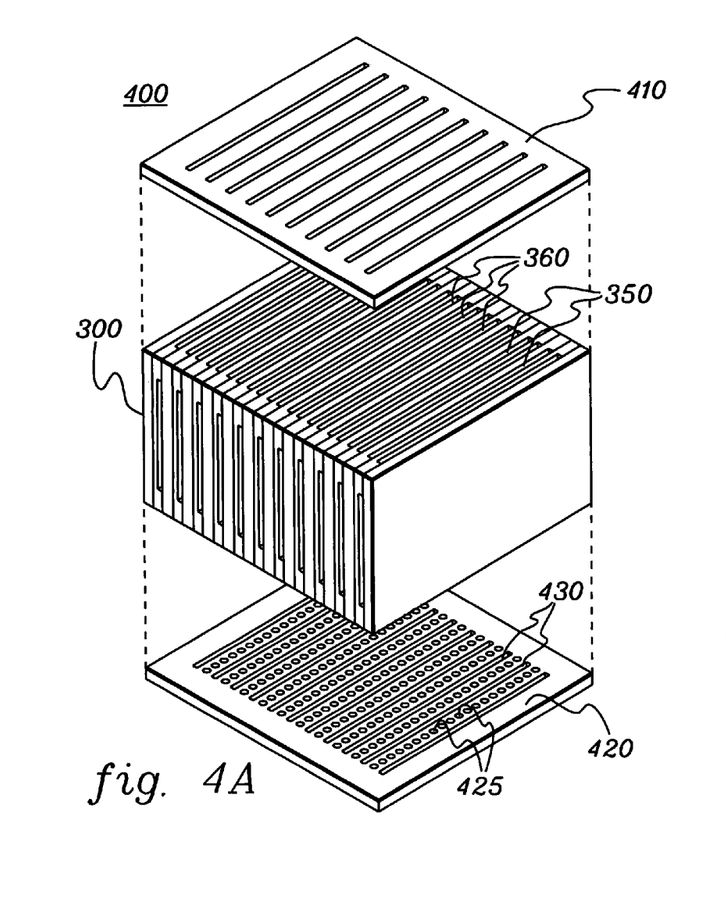
FIG. 4A is a partially exploded, isometric view of an integrated coolant inlet and outlet manifold employing the stack subassembly of FIG. 3B, as well as an inlet manifold plate and an orifice plate, in accordance with an aspect of the present invention.
Figure 4B:
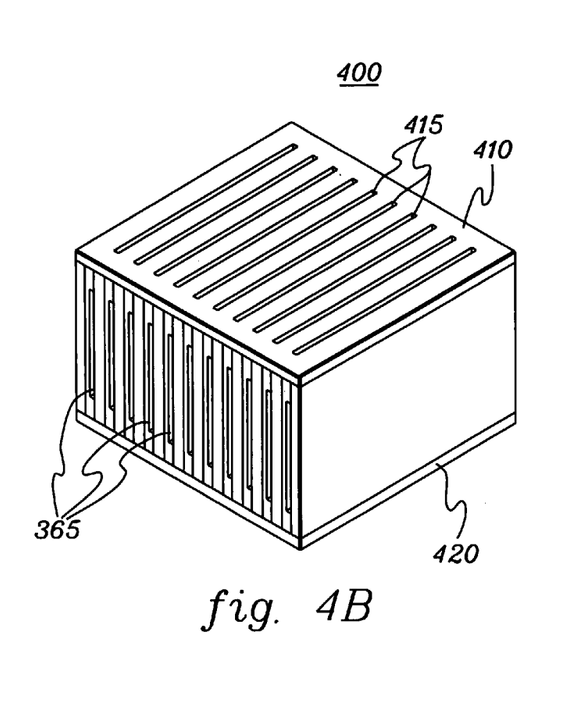
FIG. 4B is an isometric view of the assembled manifold of FIG. 4A, in accordance with an aspect of the present invention.

FIGS. 4A & 4B depict a next assembly step, wherein slots 360 are sealed or blocked at one main surface of the stack by the joining of an inlet cover plate 410 to the stack. Inlet manifold plate 410 includes a plurality of rectangular-shaped inlet openings 415, which are disposed to align with the plurality of inlet slots 350 in stack 300. Openings 415 allow the transport of inlet coolant from the inlet plenum (not shown) to, for example, jet orifices 425 in an orifice plate 420. As shown in FIG. 4A, orifice plate 420 is joined to the other main surface of manifold subassembly 300. Plate 420, in addition to having a plurality of inlet orifices 425, includes a plurality of outlet openings 430 which align to the plurality of outlet slots 360 in stack 300. As also shown in FIG. 4A, in this embodiment, multiple inlet orifices 425 are aligned in multiple rows, and the multiple rows are parallel and interdigitated with the plurality of elongated outlet openings 430. Inlet manifold plate 410 and orifice plate 420 are joined to subassembly 300, by brazing or soldering, to form the integrated coolant inlet and outlet manifold 400 of FIG. 4B.

Referring to FIG. 4B, when operational coolant flows through the inlet port into the inlet plenum, and then moves through the aligned inlet slots 415 in inlet manifold plate 410 and thereafter through the jet orifices in the orifice plate to impinge on the surface of the electronic device to be cooled (not shown). After impingement, and subsequent to heat removal from the surface to be cooled, heated coolant leaves the space defined between the opposing orifice plate 420 and surface of the electronic device being cooled through the nearest outlet opening 430 in the integrated manifold 400. Once passing through an outlet opening, the heated coolant bifurcates within the respective outlet slot 360 and turns 90 degrees to leave the integrated manifold through the corresponding exit openings 365 in the two side surfaces of manifold 400. Thus, the direction of coolant flow exhausted from the exit openings 365 in the side surfaces of integrated manifold 400 is perpendicular to the direction of intake of exhausted coolant through outlet openings 430 at the common inlet and outlet surface of the integrated manifold defined by orifice plate 420.

Figure 5A:
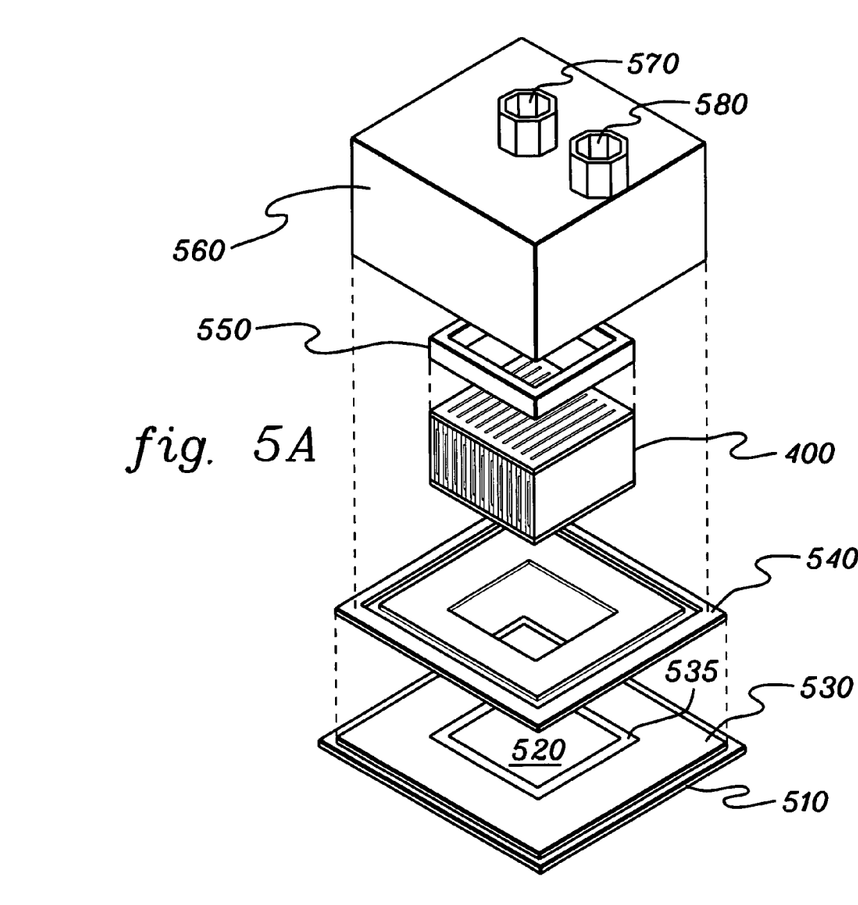
FIG. 5A is a partially exploded, isometric view of a cooled electronic module employing a cooling apparatus comprising the assembled manifold of FIG. 4B, in accordance with an aspect of the present invention.
Figure 5B:
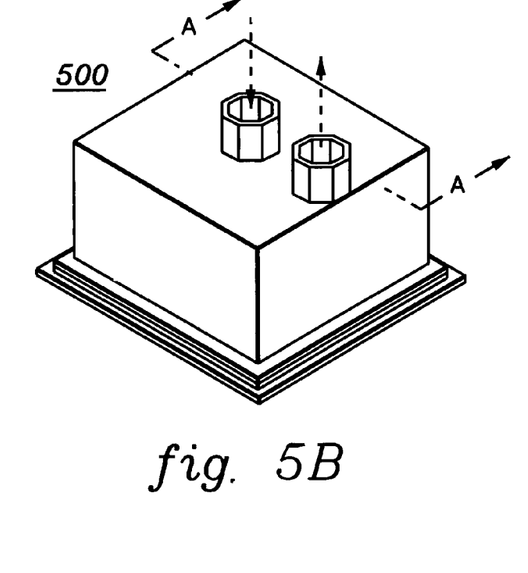
FIG. 5B is an isometric view of the assembled cooled electronic module of FIG. 5A, in accordance with an aspect of the present invention.

FIGS. 5A & 5B depict one embodiment of a cooled electronic module, generally denoted 500, in accordance with an aspect of the present invention. As shown in the exploded view of FIG. 5A, module 500 includes a substrate 510, an electronic device 520, sealing structure 530 and sealant 535. As noted in connection with the embodiment of FIG. 2, sealant 535 forms a fluid-tight seal between electronic device 520 and sealing structure 530. Further details and embodiments of the sealing structure and sealant are described in detail in the above-incorporated application entitled "Fluidic Cooling Systems and Methods for Electronic Components." In this embodiment, a cooling module bottom plate 540 creates a separation between the inlet orifices of manifold 400 and the electronic device to be cooled. The center opening in bottom plate 540 is somewhat smaller than the size of the assembled integrated manifold 400 so that manifold 400 is supported in spaced relation to the electronic device 520. An inlet plenum housing 550 is sealed to an upper portion of the integrated manifold 400 and an exit plenum housing 560 seals to bottom plate 540. Coolant is provided through an inlet port 570 in housing 560 and is exhausted through an exit port 580 in housing 560.

Figure 6:
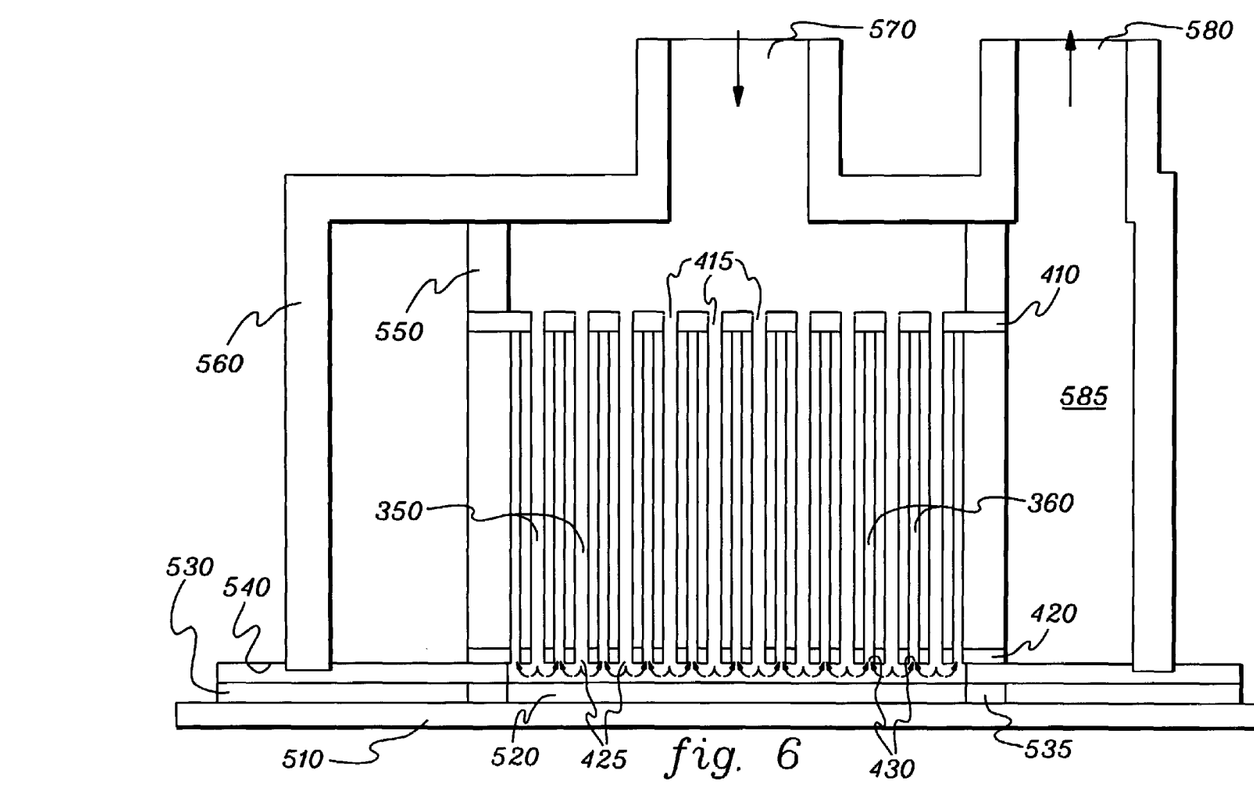
FIG. 6 is a cross-sectional elevational view of the assembled, cooled electronic module of FIG. 5B taken along line A-A, in accordance with an aspect of the present invention.

FIG. 6 is a cross-sectional elevational view of the assembled cooled electronic module 500 of FIGS. 5A & 5B, taken along lines A-A of FIG. 5B. As shown, coolant enters through inlet port 570 and is distributed through the inlet plenum into inlet slots 350 aligned with slots 415 in inlet manifold plate 410. The coolant then passes through one or more jet orifices 425 (in fluid communication with their respective inlet slot) and impinges upon the surface of the electronic device 520 to be cooled. As noted above, electronic device 520 resides on a substrate and is sealed to a sealing structure 530 by sealant 535. Bottom plate 540 resides atop sealing structure 530 and sealant 535. After impinging on the electronic device, the coolant is exhausted through an adjacent outlet opening 430 into a respective outlet slot 360. Within the outlet slots 360, coolant bifurcates and exhausts through exit openings 365 (see FIG. 4B) in the two edge surfaces of integrated manifold 400. The exhausted coolant is collected in the outlet plenum 585 and is removed through exit port 580.

Those skilled in the art will note from the above discussion that provided herein is an enhanced, integrated coolant inlet and outlet manifold structure which overcomes various disadvantages of existing liquid jet impingement designs for a cooling apparatus to cool an electronic device. Advantageously, the integrated manifold structure disclosed herein reduces pressure drop through the manifold, especially for two-phase designs and allows exhausted coolant to immediately exit after cooling the surface to be cooled. Further, a lower coolant temperature rise across the surface to be cooled in a single-phase system, and a reduced vapor build up in a two-phase system, is achieved, thus increasing the maximum allowable chip heat flux. Still further, a relatively uniform heat transfer coefficient on the surface that is to be cooled is achieved.

Although preferred embodiments have been depicted and described in detail herein, it will be apparent to those skilled in the relevant art that various modifications, additions, substitutions and the like can be made without departing from the spirit of the invention and these are therefore considered to be within the scope of the invention as defined in the following claims.

What is claimed is:

1. A cooling apparatus comprising:
an integrated coolant inlet and outlet manifold having a plurality of inlet orifices for injecting coolant onto a surface to be cooled, and a plurality of outlet openings for exhausting coolant after impinging on the surface to be cooled; and
wherein the plurality of inlet orifices and the plurality of outlet openings are interspersed in a common surface of the integrated coolant inlet and outlet manifold, and wherein a plurality of exit openings in at least one edge surface of the integrated coolant inlet and outlet manifold are in fluid communication through the integrated coolant inlet and outlet manifold with the plurality of outlet openings to facilitate exhausting of coolant through the plurality of outlet openings and minimize pressure drop through the integrated coolant inlet and outlet manifold, and wherein at least one surface plane projection of the at least one edge surface intersects a surface plane projection of the common surface.

2. The cooling apparatus of claim 1, wherein the plurality of exit openings are disposed in two edge surfaces of the integrated coolant inlet and outlet manifold, and wherein a surface plane projection of each edge surface of the two edge surfaces intersects the surface plane projection of the common surface.

3. The cooling apparatus of claim 2, further comprising a plurality of outlet slots disposed in the integrated coolant inlet and outlet manifold, the plurality of outlet slots being in fluid communication with the plurality of outlet openings in the common surface and the plurality of exit openings in the two edge surfaces, and wherein when in operation, a bifurcated coolant flow exists within each outlet slot of the plurality of outlet slots from at least one outlet opening of the plurality of outlet openings to at least two exit openings of the plurality of exit openings in the two edge surfaces of the integrated coolant inlet and outlet manifold.

4. The cooling apparatus of claim 1, wherein a total surface area opening of the plurality of outlet openings is greater than a total surface area opening of the plurality of inlet orifices.

5. The cooling apparatus of claim 4, wherein the plurality of inlet orifices comprises a plurality of jet orifices in the common surface of the integrated coolant inlet and outlet manifold.

6. The cooling apparatus of claim 1, wherein the integrated coolant inlet and outlet manifold comprises a plurality of assembled plates, and wherein the at least one edge surface of the integrated coolant inlet and outlet manifold is perpendicular to and extends from the common surface of the integrated coolant inlet and outlet manifold.

7. The cooling apparatus of claim 1, wherein the plurality of outlet openings comprise a plurality of elongated outlet openings, and wherein the plurality of inlet orifices are aligned in multiple rows in the common surface of the integrated coolant inlet and outlet manifold, and wherein the multiple rows of inlet orifices and the plurality of elongated outlet openings are disposed interdigitized in the common surface of the integrated coolant inlet and outlet manifold.

8. The cooling apparatus of claim 1, wherein the integrated coolant inlet and outlet manifold further comprises a plurality of inlet slots and a plurality of outlet slots disposed therein, the plurality of inlet slots being in fluid communication with the plurality of inlet orifices for facilitating injecting of coolant onto the surface to be cooled, and the plurality of outlet slots being in fluid communication with the plurality of outlet openings and the plurality of exit openings for facilitating exhausting of coolant after impinging on the surface to be cooled, and wherein the plurality of inlet slots are disposed parallel and interdigitized with the plurality of outlet slots within the integrated coolant inlet and outlet manifold.

9. A cooled electronic module comprising:
a substrate;
at least one heat generating electronic device to be cooled coupled to the substrate; and
a cooling apparatus for cooling at least one surface of the at least one heat generating electronic device, the cooling apparatus comprising:
an integrated coolant inlet and outlet manifold having a plurality of inlet orifices for injecting coolant onto the at least one surface to be cooled, and a plurality of outlet openings for exhausting coolant after impinging on the at least one surface to be cooled; and
wherein the plurality of inlet orifices and the plurality of outlet openings are interspersed in a common surface of the integrated coolant inlet and outlet manifold, and wherein a plurality of exit openings in at least one edge surface of the integrated coolant inlet and outlet manifold are in fluid communication through the integrated coolant inlet and outlet manifold with the plurality of outlet openings to facilitate exhausting of coolant through the plurality of outlet openings and minimize pressure drop through the integrated coolant inlet and outlet manifold, and wherein at least one surface plane projection of the at least one edge surface intersects a surface plane projection of the common surface.

10. The cooled electronic module of claim 9, wherein the plurality of exit openings are disposed in two edge surfaces of the integrated coolant inlet and outlet manifold, and wherein a surface plane projection of each edge surface of the two edge surfaces intersects the surface plane projection of the common surface.

11. The cooled electronic module of claim 10, further comprising a plurality of outlet slots disposed in the integrated coolant inlet and outlet manifold, the plurality of outlet slots being in fluid communication with the plurality of outlet openings in the common surface and the plurality of exit openings in the two edge surfaces, and wherein when in operation, a bifurcated coolant flow exists within each outlet slot of the plurality of outlet slots from at least one outlet opening of the plurality of outlet openings to at least two exit openings of the plurality of exit openings in the two edge surfaces of the integrated coolant inlet and outlet manifold.

12. The cooled electronic module of claim 9, wherein the plurality of inlet orifices comprises a plurality of jet orifices in the common surface of the integrated coolant inlet and outlet manifold.

13. The cooled electronic module of claim 9, wherein the integrated coolant inlet and outlet manifold comprises a plurality of assembled plates, and wherein the at least one edge surface of the integrated coolant inlet and outlet manifold is perpendicular to and extends from the common surface of the integrated coolant inlet and outlet manifold.

14. The cooled electronic module of claim 9, wherein the plurality of outlet openings comprise a plurality of elongated outlet openings, and wherein the plurality of inlet orifices are aligned in multiple rows in the common surface of the integrated coolant inlet and outlet manifold, and wherein the multiple rows of inlet orifices and the plurality of elongated outlet openings are disposed interdigitized in the common surface of the integrated coolant inlet and outlet manifold.

15. The cooled electronic module of claim 9, wherein the integrated coolant inlet and outlet manifold further comprises a plurality of inlet slots and a plurality of outlet slots disposed therein, the plurality of inlet slots being in fluid communication with the plurality of inlet orifices for facilitating injecting of coolant onto the at least one surface to be cooled, and the plurality of outlet slots being in fluid communication with the plurality of outlet openings and the plurality of exit openings for facilitating exhausting of coolant after impinging on the at least one surface to be cooled, and wherein the plurality of inlet slots are disposed parallel and interdigitized with the plurality of outlet slots within the integrated coolant inlet and outlet manifold.

16. A method of fabricating a cooling apparatus comprising:
providing an integrated coolant inlet and outlet manifold having a plurality of inlet orifices for injecting coolant onto a surface to be cooled, and a plurality of outlet openings for exhausting coolant after impinging on the surface to be cooled; and
wherein the plurality of inlet orifices and the plurality of outlet openings are interspersed in a common surface of the integrated coolant inlet and outlet manifold, and wherein a plurality of exit openings in at least one edge surface of the integrated coolant inlet and outlet manifold are in fluid communication through the integrated coolant inlet and outlet manifold with the plurality of outlet openings to facilitate exhausting of coolant through the plurality of outlet openings and minimize pressure drop through the integrated coolant inlet and outlet manifold, and wherein at least one surface plane projection of the at least one edge surface intersects a surface plane projection of the common surface.

17. The method of claim 16, wherein the providing comprises providing a plurality of exit openings in two edge surfaces of the integrated coolant inlet and outlet manifold, and wherein a surface plane projection of each edge surface of the two edge surfaces intersects the surface plane projection of the common surface.

18. The method of claim 17, wherein the providing further comprises providing a plurality of outlet slots disposed in the integrated coolant inlet and outlet manifold, the plurality of outlet slots being in fluid communication with the plurality of outlet openings in the common surface and the plurality of exit openings in the two edge surfaces, and wherein when in operation, a bifurcated coolant flow exists within each outlet slot of the plurality of outlet slots from at least one outlet opening of the plurality of outlet openings to at least two exit openings of the plurality of exit openings in the two edge surfaces of the integrated coolant inlet and outlet manifold.

19. The method of claim 16, wherein the providing further comprises providing the integrated coolant inlet and outlet manifold as a plurality of assembled plates, and wherein the at least one edge surface of the integrated coolant inlet and outlet manifold is perpendicular to and extends from the common surface of the integrated coolant inlet and outlet manifold.

20. The method of claim 16, wherein the providing further comprises providing the integrated coolant inlet and outlet manifold with a plurality of inlet slots and a plurality of outlet slots disposed therein, the plurality of inlet slots being in fluid communication with the plurality of inlet orifices for facilitating injecting of coolant onto the surface to be cooled, and the plurality of outlet slots being in fluid communication with the plurality of outlet openings and the plurality of exit openings for facilitating exhausting of coolant after impinging on the surface to be cooled, and wherein the plurality of inlet slots are disposed parallel and interdigitized with the plurality of outlet slots within the integrated coolant inlet and outlet manifold.

* * * * *